United States Patent
Yamaguchi et al.

(10) Patent No.: US 9,982,347 B2
(45) Date of Patent: May 29, 2018

(54) CLEANING METHOD, METHOD OF MANUFACTURING SEMICONDUCTOR DEVICE AND SUBSTRATE PROCESSING APPARATUS

(71) Applicant: HITACHI KOKUSAI ELECTRIC INC., Tokyo (JP)

(72) Inventors: Takatomo Yamaguchi, Toyama (JP); Takafumi Sasaki, Toyama (JP); Koei Kuribayashi, Toyama (JP)

(73) Assignee: Hitachi Kokusai Electric, Inc., Tokyo (JP)

(*) Notice: Subject to any disclaimer, the term of this patent is extended or adjusted under 35 U.S.C. 154(b) by 0 days. days.

(21) Appl. No.: 15/672,901

(22) Filed: Aug. 9, 2017

(65) Prior Publication Data
US 2018/0044794 A1  Feb. 15, 2018

(30) Foreign Application Priority Data

Aug. 10, 2016 (JP) .................... 2016-157639

(51) Int. Cl.
| | | |
|---|---|---|
| H01L 21/02 | (2006.01) | |
| C23C 16/56 | (2006.01) | |
| B08B 9/08 | (2006.01) | |
| B08B 5/00 | (2006.01) | |

(52) U.S. Cl.
CPC ............... *C23C 16/56* (2013.01); *B08B 5/00* (2013.01); *B08B 9/08* (2013.01)

(58) Field of Classification Search
CPC ......... H01L 21/02507; H01L 21/02334; H01L 21/02337
See application file for complete search history.

(56) References Cited

U.S. PATENT DOCUMENTS

| | | | |
|---|---|---|---|
| 2012/0298040 A1* | 11/2012 | Woelk | B01D 7/00 118/726 |
| 2014/0112739 A1* | 4/2014 | Hirano | H01L 21/67017 414/217.1 |
| 2017/0248973 A1* | 8/2017 | Teich | G05D 7/0635 |
| 2017/0299420 A1* | 10/2017 | Shiroyama | G01F 25/0007 |

FOREIGN PATENT DOCUMENTS

| | | |
|---|---|---|
| JP | 2004-197127 A | 7/2004 |
| JP | 2014-170786 A | 9/2014 |

* cited by examiner

*Primary Examiner* — Jae Lee

(74) *Attorney, Agent, or Firm* — Volpe and Koenig, P.C.

(57) ABSTRACT

A cleaning method includes: removing deposits adhered to an inside of a processing vessel by forming a film on a substrate in the processing vessel, and thereafter, supplying a cleaning gas into the processing vessel, wherein the removing the deposits includes: a first step of supplying the cleaning gas into the processing vessel at a first flow rate when a temperature of a connection portion connecting an exhaust pipe that exhausts the interior of the processing vessel and the processing vessel is lower than a first temperature; and a second step of supplying the cleaning gas to the processing vessel while gradually decreasing the flow rate of the cleaning gas from the first flow rate to a second flow rate lower than the first flow rate when the temperature of the connection portion reaches a first temperature.

7 Claims, 3 Drawing Sheets

CLEANING METHOD, METHOD OF MANUFACTURING SEMICONDUCTOR DEVICE AND SUBSTRATE PROCESSING APPARATUS

BACKGROUND

Technical Field

The present invention relates to a cleaning method, a method of manufacturing a semiconductor device, and a substrate processing apparatus.

Related Art

As one process of a plurality processes of manufacturing a semiconductor device, sometimes, a film formation process may be performed in which a source gas or a reaction gas is supplied to a substrate in a processing chamber to form a film on the substrate. When the film formation process is performed, some undesirable deposits may be adhered to the inside of the processing chamber. For this reason, after the film formation process, sometimes, a cleaning process may be carried out in which a cleaning gas is supplied into the processing chamber to remove the deposits accumulate on the inside of the processing chamber. In the cleaning process, sometimes, damage such as corrosion is given to an exhaust pipe by the cleaning gas (refer to, for example, JP 2014-170786 A).

SUMMARY

The invention is made in consideration of the above circumstances to provide a technique capable of suppressing damage on an exhaust pipe caused by a cleaning gas.

According to an aspect of the present disclosure,
provided is a technique including:
removing deposits adhered to an inside of a processing vessel by forming a film on a substrate in the processing vessel, and after that, supplying a cleaning gas into the processing vessel,
wherein the removing the deposits includes:
a first step ($S_1$) of supplying the cleaning gas into the processing vessel at a first flow rate when a temperature of a connection portion connecting an exhaust pipe that exhausts the interior of the processing vessel and the processing vessel is lower than a first temperature; and
a second step ($S_2$) of supplying the cleaning gas to the processing vessel while gradually decreasing the flow rate of the cleaning gas from the first flow rate to a second flow rate lower than the first flow rate when the temperature of the connection portion reaches a first temperature.

According to the disclosure, it is possible to provide a technique capable of suppressing damage to the exhaust pipe caused by a cleaning gas.

DETAILED DESCRIPTION

Figure 1:
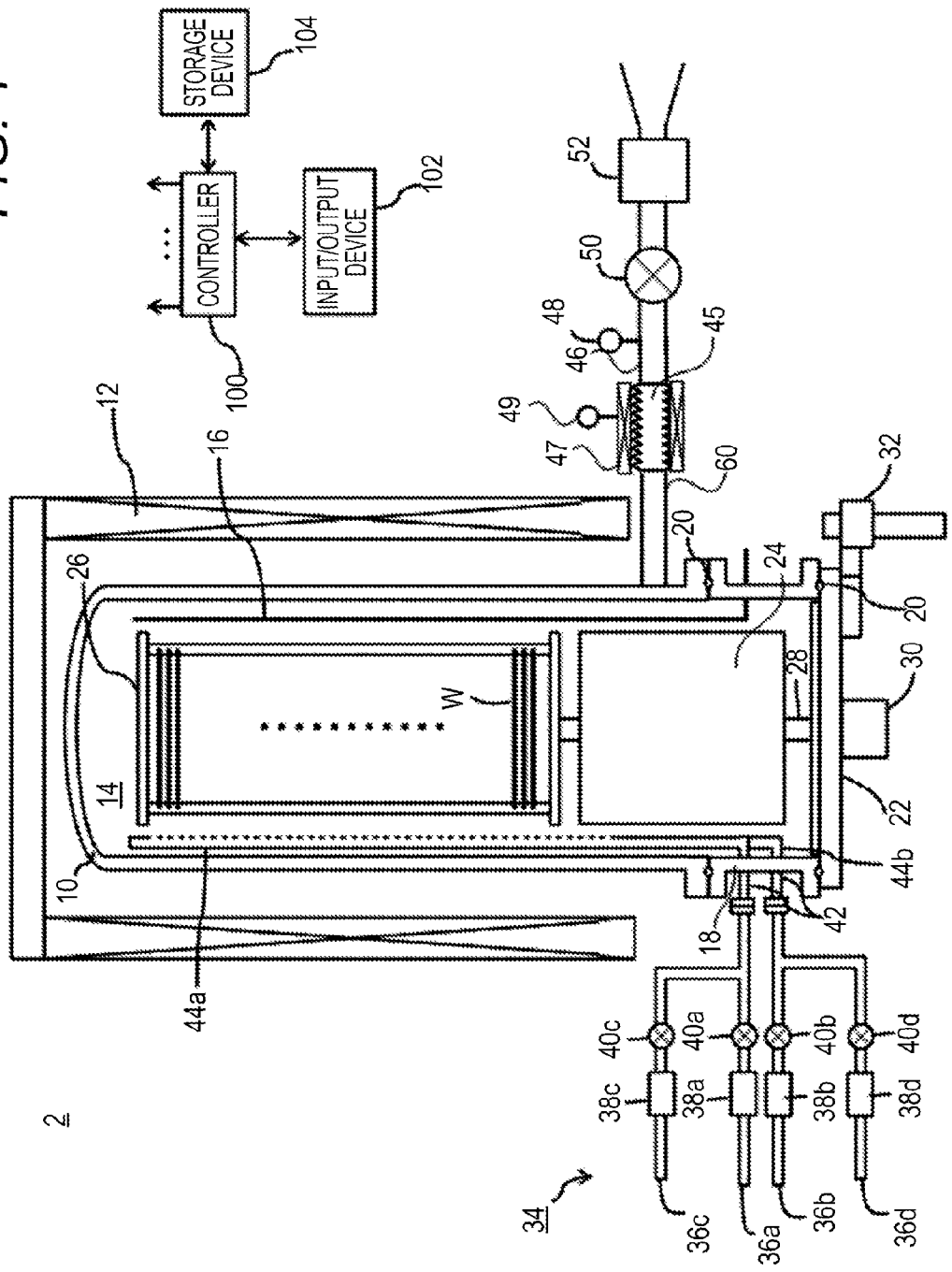
FIG. 1 is a longitudinal cross-sectional diagram schematically illustrating a substrate processing apparatus of one embodiment.

Hereinafter, non-limitative exemplary embodiments of the invention will be described with reference to the drawings. In all the drawings, the same or corresponding components are denoted by the same or corresponding reference numerals, and redundant descriptions thereof are omitted.

In the embodiment, a substrate processing apparatus is configured as a vertical substrate processing apparatus (hereinafter, referred to as a processing apparatus) 2 that performs a substrate process such as heat treatment as one step in a manufacturing process in a method of manufacturing a semiconductor device. As illustrated in FIG. 1, the processing apparatus 2 is configured to include a cylindrical reaction tube 10 and a heater 12 as a heating unit (heating mechanism) installed around the reaction tube 10. The reaction tube 10 is formed of, for example, quartz or SiC. A temperature detection unit 16 as a temperature detector is installed in the reaction tube 10. The temperature detection unit 16 is erected along the inner wall of the reaction tube 10.

A cylindrical manifold 18 is connected to the lower end opening of the reaction tube 10 through a sealing member 20 such as an O-ring and supports the lower end of the reaction tube 10. The manifold 18 is made of a metal such as stainless steel. A processing vessel is configured with the reaction tube 10 and the manifold 18. A processing chamber 14 for processing a wafer W as a substrate is formed inside the processing vessel. The lower end opening of the manifold 18 is opened and closed by a disc-shaped lid 22. The lid 22 is formed of, for example, a metal. A sealing member 20 such as an O-ring is installed on the upper surface of the lid 22, so that the reaction tube 10 is hermetically closed (sealed), and the atmosphere in the reaction tube 10 and the outside air are shut off. A heat insulating portion 24 in which a hole is formed vertically at the center is disposed on the lid 22. The heat insulating portion 24 is formed of, for example, quartz or SiC.

The processing chamber 14 accommodates a boat 26 as a substrate retainer for vertically retaining a plurality of wafers W, for example, 25 to 150 wafers W in a shelf shape. The boat 26 is formed of, for example, quartz or SiC. The boat 26 is supported above the heat insulating portion 24 by a rotation shaft 28 penetrating the hole of the lid 22 and the heat insulating portion 24. For example, a magnetic fluid seal is provided in a portion where the rotation shaft 28 of the lid 22 penetrates, and the rotation shaft 28 is connected to a rotation mechanism 30 installed below the lid 22. Accordingly, the rotation shaft 28 is configured to be rotatable while the interior of the reaction tube 10 is hermetically sealed. The lid 22 is vertically driven by a boat elevator 32 as an elevation mechanism. Accordingly, the boat 26 and the lid 22 are integrally moved up and down, and thus, the boat 26 is carried in and out with respect to the reaction tube 10.

The processing apparatus 2 is configured to include a gas supply mechanism 34 for supplying gases used for the substrate process into the processing chamber 14. The gas supplied by the gas supply mechanism 34 is changed according to the type of the film to be formed. Herein, the gas supply mechanism 34 is configured to include a source gas supply unit, a reaction gas supply unit, a cleaning gas supply unit, and an inert gas supply unit. The source gas supply unit and the reaction gas supply unit constitute a film forming gas supply unit. The inert gas supply unit may be included in the film forming gas supply unit.

The source gas supply unit is configured to include a gas supply pipe 36a. In order from the upstream direction, a mass flow controller (MFC) 38a as a flow rate controller (flow rate control unit) and a valve 40a as an on-off valve are provided in the gas supply pipe 36a. The gas supply pipe 36a is connected to a nozzle 44a penetrating the side wall of the manifold 18. The nozzle 44a is installed to be erected along the vertical direction in the reaction tube 10 and has a plurality of supply holes that are opened to face the wafer W retained by the boat 26. The source gas is supplied to the wafer W through the supply holes of the nozzle 44a.

Hereinafter, in the same configuration, the reaction gas is supplied from the reaction gas supply unit to the wafer W through the gas supply pipe 36b, the MFC 38b, the valve 40b, and the nozzle 44b. An inert gas is supplied from the inert gas supply unit to the wafer W through the gas supply pipes 36c and 36d, the MFCs 38c and 38d, the valves 40c and 40d, and the nozzles 44a and 44b. A cleaning gas is supplied from the cleaning gas supply unit to the wafer W through the gas supply pipes 36a and 36b, the MFCs 38a and 36b, the valves 40a and 40b, and the nozzles 44a and 44b.

An exhaust portion 60 is formed in the reaction tube 10, and a metal exhaust connection portion (connection portion) 45 is attached thereto. The exhaust connection portion 45 is configured to be disposed between the exhaust port 60 and an exhaust pipe 46 to form an exhaust path. The exhaust connection portion 45 is formed in an expandable bellows shape from a metal such as stainless steel. The exhaust pipe 46 is connected to a pressure sensor 48 as a pressure detector (pressure detection unit) for detecting the internal pressure of the processing chamber 14 and an auto pressure controller (APC) valve 50 as a pressure regulator (pressure regulation unit), and a vacuum pump 52 as a vacuum evacuation device. With such a configuration, the internal pressure of the processing chamber 14 can be set to the processing pressure according to the process.

In the exhaust connection portion 45, a heating unit (pipe heater) 47 for heating the exhaust connection portion 45 is provided so as to cover the exhaust connection portion 45 over the entire circumference. The heating unit 47 is provided with a temperature detector 49 for detecting the temperature of the heating unit 47 or the exhaust connection portion 45. The exhaust connection portion 45 may be exposed to various temperatures for the purpose of avoiding condensation of gases and removing the deposits. For the complex shape and flexibility of it, ceramic techniques such as thermal spraying of $Y_2O_3$ do not suit for the exhaust connection portion 45.

Figure 2:
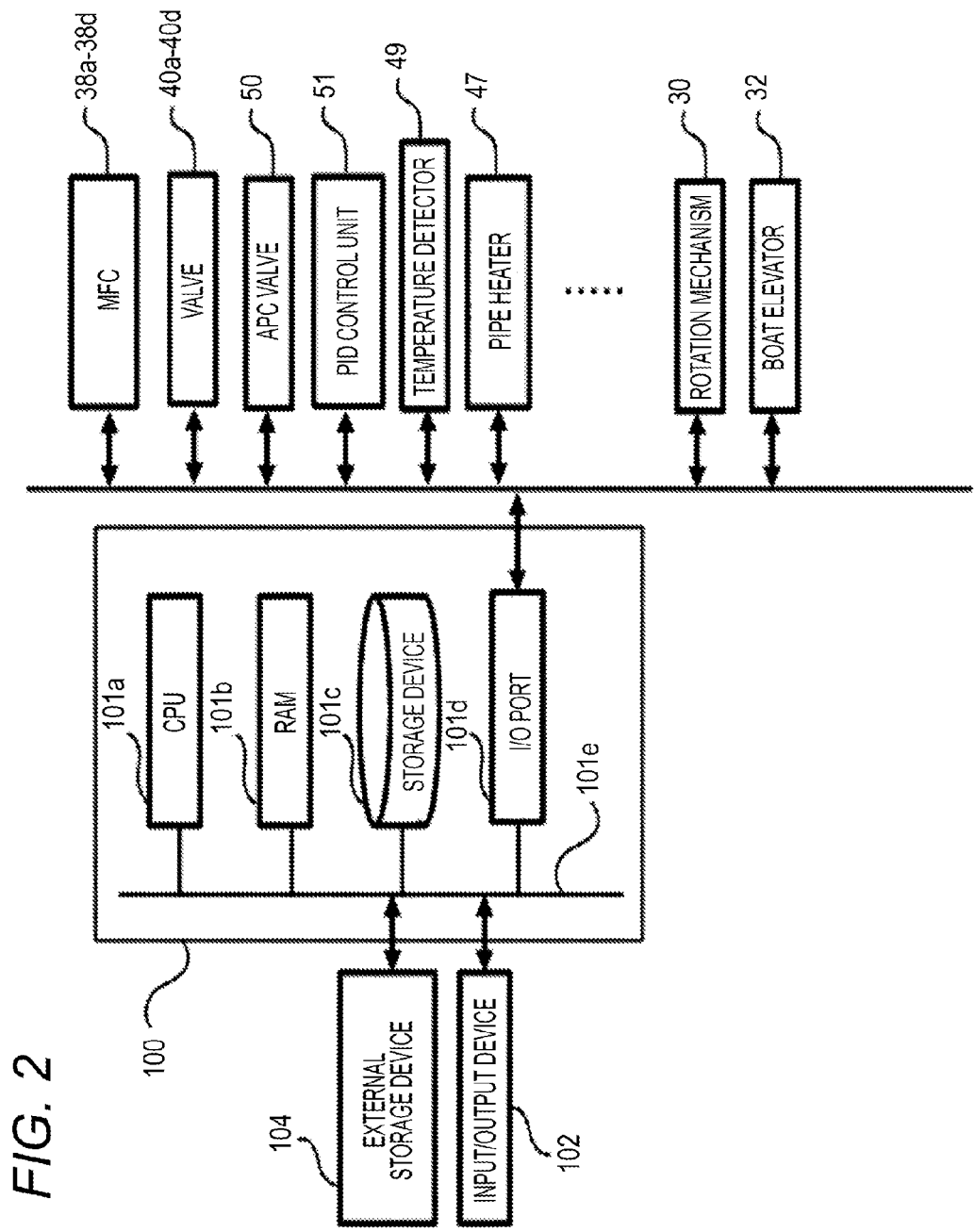
FIG. 2 is a diagram illustrating a controller in the embodiment.

As illustrated in FIG. 2, the controller 100 as a control unit is configured as a computer including a central processing unit (CPU) 101a, a random access memory (RAM) 101b, a storage device 101c, and an I/O port 101d. The RAM 101b, the storage device 101c and the I/O port 101d are configured to exchange data with the CPU 101a via an internal bus 101e. An input/output device 102 configured as a touch panel or the like is connected to the controller 100.

The storage device 101c is configured with, for example, a flash memory, a hard disk drive (HDD), or the like. The storage device 101c stores, in a readable manner, a control program for controlling the operations of the processing apparatus 2 and a process recipe in which later-described procedures and conditions of the substrate process such as a film formation process are described. In addition, the process recipe is configured as a combination of the procedures in the later-described substrate process so that the controller 100 executes the procedures to obtain predetermined results, and functions as a program. Hereinafter, the process recipe, the control program, and the like are collectively referred to simply as a program. In this specification, the term "program" may be used to include only a process recipe, to include only a control program, or to include both cases. In addition, the RAM 101b is configured as a memory area (work area) in which programs, data, and the like read by the CPU 101a are temporarily retained.

The I/O port 101d is connected to the MFCs 38a, 38b, 38c, and 38d, the valves 40a, 40b, 40c, and 40d, the heater 12, the pipe heater 47, the rotation mechanism 30, the temperature detector 49, the APC valve 50, the PID controller 51 and the like. In addition, the I/O port 101d is also connected to a power regulator (not illustrated), a heater power supply, a pressure sensor, and a vacuum pump.

The CPU 101a is configured to read and execute a control program from the storage device 101c and to read a process recipe from the storage device 101c in response to an input of an operation command from the input/output device 102 or the like. Then, in accordance with contents of the read process recipe, the CPU 101a is configured to control flow rate adjusting operations for various gases by the MFCs 38a, 38b, 38c, and 38d, opening/closing operations for the valves 40a, 40b, 40c, and 40d, opening/closing operations for the APC valve 50, a pressure regulating operation by the APC valve 50 on the basis of the pressure sensor, a temperature adjusting operation for the heater 12 on the basis of the detection value of the temperature detection unit 16, a temperature adjusting operation of the pipe heater 47 on the basis of the detection value of the temperature detector 49, activating and stopping of the vacuum pump, rotation and rotation speed adjusting operations for the boat 26 by the rotation mechanism 30, elevation operations for the boat 26 by the boat elevator 32, or the like or to perform PID control of the gas flow rate on the basis of the detection value of the temperature detector 49.

The controller 100 is not limited to the case where the controller is configured as a dedicated computer, but the controller may be configured as a general-purpose computer. For example, by preparing an external storage device (for example, a magnetic tape, a magnetic disk such as a flexible disk or a hard disk, an optical disk such as a CD or a DVD, a magneto-optical disk such as an MO, or a semiconductor memory such as a USB memory or a memory card) 303 and by installing a program in a general-purpose computer using the external storage device 104, it is possible to configure the controller 100 according to the embodiment. In addition, a unit for supplying the program to the computer is not limited to the case of supplying the program through the external storage device 104. For example, a communication unit such as the Internet or a dedicated line may be used to supply the program without using the external storage device 104. In addition, the storage device 101c and the external storage device 104 are configured as a computer-readable and tangible recording medium. Hereinafter, these are collectively referred to simply as a recording medium. In addition, in this specification, the term "recording medium" may be used to include only the storage device 101c alone, to include only the external storage device 104 alone, or to include both cases.

Next, a process (film formation process) of forming a film on a substrate by using the above-described processing apparatus 2 will be described. Herein, an example of forming a silicon nitride (SiN) film on the wafer W by supplying DCS ($SiH_2Cl_2$: dichlorosilane) gas as a source gas and $NH_3$ (ammonia) gas as a reaction gas into the processing vessel, that is, to the wafer W in the processing chamber 13 will be described. In addition, in the following description, the operation of each component constituting the processing apparatus 2 is controlled by the controller 100.

(Wafer Charging and Boat Loading)

When a plurality of wafers W are loaded (wafer charged) in the boat 26, the boat 26 is carried (boat loaded) into the processing chamber 14 by the boat elevator 32, and the lower opening of the reaction tube 10 is hermetically sealed by the lid 22.

(Pressure Regulation and Temperature Adjustment)

Vacuum evacuation (depressurization evacuation) is performed by the vacuum pump 52 so that the processing chamber 14 has a predetermined internal pressure (degree of vacuum). The internal pressure of the processing chamber 14 is measured by a pressure sensor 48, and the APC valve 50 is feedback-controlled on the basis of the measured pressure information. In addition, the wafer W in the processing chamber 14 is heated by the heater 12 so that the wafer W has a predetermined temperature. At this time, the state of energization to the heater 12 is feedback-controlled on the basis of the temperature information detected by the temperature detection unit 16 so that the processing chamber 14 has a predetermined temperature distribution. In addition, the rotation of the boat 26 and the wafer W by the rotation mechanism 30 is started. In addition, the pipe heater 47 is energized so that the temperature of the exhaust pipe 46 is a predetermined temperature lower than the internal temperature of the processing chamber 14 and higher than a tolerance temperature described later, and the exhaust connection portion 45 is heated by the pipe heater 47. The exhaust connection portion 45 is heated by the pipe heater 47, so that it is possible to suppress adhesion of deposits to the inside of the exhaust connection portion 45 in the film formation process.

(Film Formation Process)

[Source Gas Supply Process]

When the internal temperature of the processing chamber 14 is stabilized at a predefined processing temperature and the exhaust connection portion 45 reaches a predetermined temperature, DCS gas is supplied to the wafer W in the processing chamber 14. The DCS gas is controlled to have a desired flow rate by the MFC 38a and is supplied into the processing chamber 14 through the gas supply pipe 36a and the nozzle 44a.

[Source Gas Exhaust Process]

Next, the supply of the DCS gas is stopped, and the interior of the processing chamber 14 is vacuum-evacuated by the vacuum pump 52. At this time, $N_2$ gas may be supplied as an inert gas from the inert gas supply unit into the processing chamber 14 (Inert Gas Purging).

[Reaction Gas Supply Process]

Next, $NH_3$ gas is supplied to the wafer W in the processing chamber 14. The $NH_3$ gas is controlled to have a desired flow rate by the MFC 38b and is supplied into the processing chamber 14 through the gas supply pipe 36b and the nozzle 44b.

[Reaction Gas Exhaust Process]

Next, the supply of the $NH_3$ gas is stopped, and the interior of the processing chamber 14 is vacuum-evacuated by the vacuum pump 52. At this time, the $N_2$ gas may be supplied from the inert gas supply unit into the processing chamber 14 (Inert Gas Purging).

A SiN film having a predetermined composition and a predetermined film thickness can be formed on the wafer W by performing a cycle of performing the above-described four processes a predetermined number of times (one or more times).

(Boat Unloading and Wafer Discharging)

After the film having a predetermined film thickness is formed, $N_2$ gas is supplied from the inert gas supply unit, the internal gas of the processing chamber 14 is replaced with the $N_2$ gas, and the internal pressure of the processing chamber 14 is restored to normal pressure. After that, the lid 22 is moved down by the boat elevator 32, and thus, the boat 26 is unloaded from the reaction tube 10 (boat unloading). After that, the processed wafer W is discharged from the boat 26 (wafer discharging).

Processing conditions for forming the SiN film on the wafer W are exemplified, as follows.

Processing temperature (wafer temperature): 300° C. to 700° C.

Processing pressure (internal pressure of the processing chamber) 1 Pa to 4000 Pa DCS gas: 100 sccm to 10000 sccm $NH_3$ gas: 100 sccm to 10000 sccm $N_2$ gas: 100 sccm to 10000 sccm, By setting the respective processing conditions to values within the respective ranges, it becomes possible to appropriately perform the film formation process.

Next, the cleaning process will be described.

When the film formation process is performed, in some cases, deposits including thin films are adhered to the inside of the processing vessel (the inside of the processing chamber), the inside of the exhaust connection portion, and the inside of the exhaust pipe. When the cleaning process is performed to remove the deposits, heat generation (reaction heat) may occur when the deposits and the cleaning gas react with each other in the processing chamber, in the exhaust connection portion, and in the exhaust pipe. The exhaust connection portion and the exhaust pipe are made of a metal, and when the exhaust connection portion and the exhaust pipe come into contact with the cleaning gas at a temperature higher than the tolerance temperature, in some cases, the exhaust connection portion and the exhaust pipe may corrode and particles may be generated. For this reason, it is necessary to perform cleaning while maintaining the exhaust connection portion and the exhaust pipe at a temperature equal to or lower than the tolerance temperature. Herein, the tolerance temperature is the upper limit temperature at which corrosion does not occur in the metal member such as the exhaust connection portion and the exhaust pipe caused by contact with the cleaning gas. When the temperature exceeds the tolerance temperature, corrosion occurs in the metal member due to contact with the cleaning gas.

In order to perform the cleaning process at a temperature equal to or lower than the tolerance temperature, an operator may manually perform the supply and stop supply of the cleaning gas or may produce a sequence of the supply and the stop of supply of the cleaning gas on the basis of operator's experience. However, such methods are inefficient, and since the supply of the cleaning gas is stopped, in some cases, the cleaning time may be lengthened. As a result of the inventor's intensive studies, the inventors have found that the cleaning process can be performed at a temperature equal to or lower than the tolerance temperature by controlling the flow rate of the cleaning gas on the basis of the temperature of the exhaust connection portion, and furthermore, during the cleaning process, it is possible to continuously supply the gas.

Hereinafter, the cleaning process in the disclosure will be described.

(Cleaning Process)

When the film formation process is completed, cleaning is performed in the processing vessel, that is, in the processing chamber 14, in the exhaust connection portion 45, and in the exhaust pipe 46. In the cleaning, for example, $F_2$ (fluorine) gas and NO (nitrogen monoxide) gas are used. First, the boat 26 is carried into the processing chamber 14 by the boat elevator 32, and the lower opening of the reaction tube 10 is hermetically sealed by the lid 22. Next, the energization to the pipe heater 47 is stopped, and the heating of the exhaust connection portion 45 by the pipe heater 47 is stopped. When the temperature of the exhaust connection portion 45 drops down to a predetermined temperature (for example, 120° C.) lower than the tolerance temperature, the cleaning process is started. In addition, the temperature of the exhaust connection portion 45 is detected by the temperature detector 49. Since the pipe heater 47 is powered off in the cleaning process, the temperature detected by the temperature detector 49 installed in the pipe heater 47 can be considered to be substantially the same as the temperature of the exhaust connection portion 45.

The flow rate of the $F_2$ gas is controlled by the MFC 38a from the gas supply pipe 36a and is supplied into the processing chamber 14 through the valve 40a and the nozzle 44a for supplying the source gas. The flow rate of the NO gas is controlled by the MFC 38b from the gas supply pipe 36b, and the NO gas is supplied into the processing chamber 14 through the valve 40b and the nozzle 44b that supplies the reaction gas. The $F_2$ gas and the NO gas (collectively referred to as a cleaning gas) supplied into the processing chamber 14 react with each other to clean the interior of the processing chamber 14.

The flow rate of the cleaning gas is controlled by the MFCs 38a and 38b to be supplied into the processing chamber 14. At this time, the temperature of the exhaust pipe 46 is detected by the temperature detector 49, and the detection value is received by the PID (proportional-integral-derivative) controller 51 as an input signal. The PID controller 51 calculates the supply flow rate on the basis of the input signal and transmits the calculated value as an output signal to the MFCs 38a and 38b. In this manner, the flow rate of the cleaning gas is controlled by the MFCs 38a and 38b so that the temperature of the exhaust connection portion 45 does not exceed the tolerance temperature. A specific control sequence will be described with reference to FIGS. 3A and 3B.

Figures 3A, 3B:
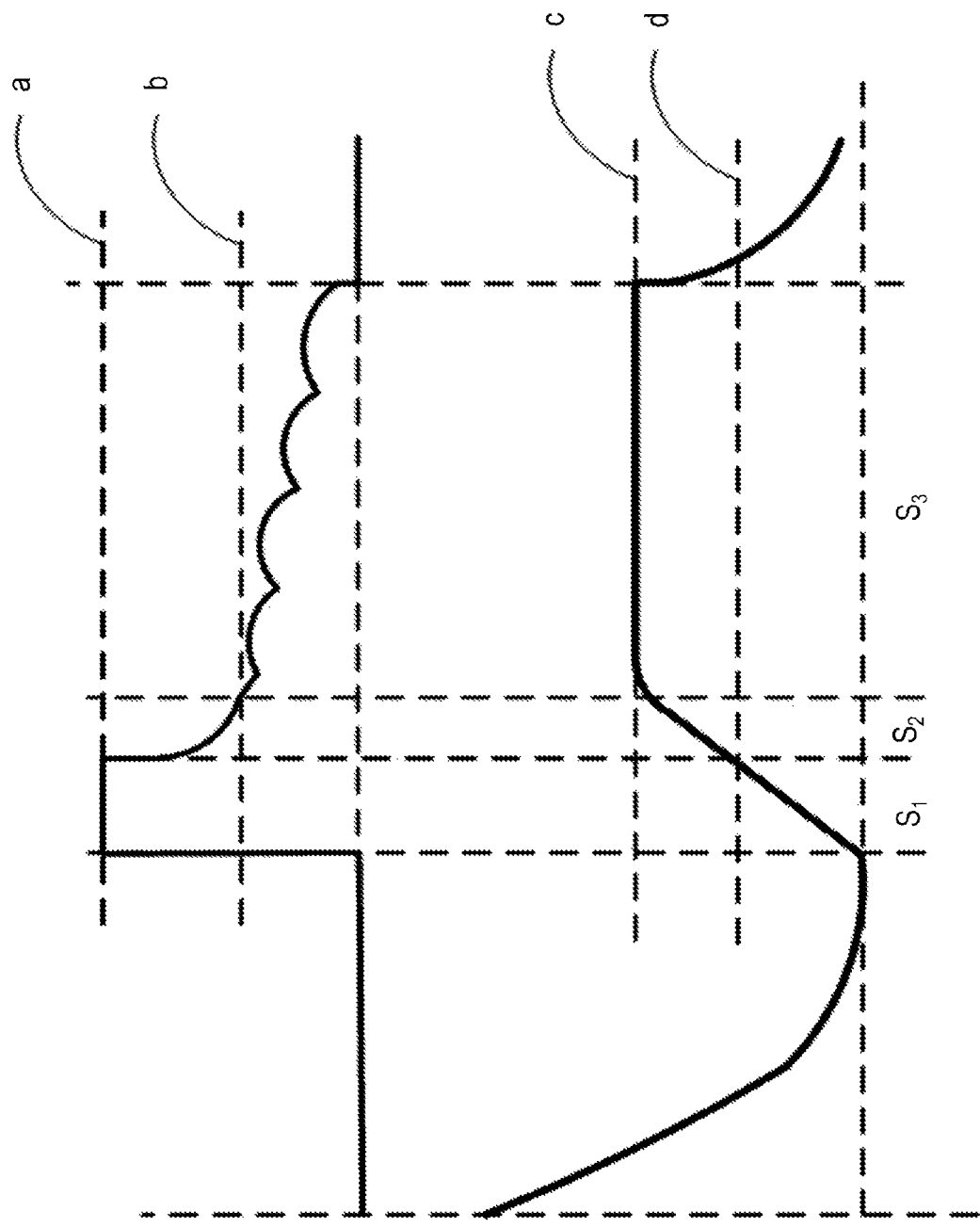
FIGS. 3A and 3B are diagrams illustrating a relationship between a cleaning gas flow rate and an exhaust pipe temperature in the embodiment.

FIGS. 3A and 3B illustrate the cleaning sequence according to the disclosure. FIG. 3A illustrates a relationship between the flow rate of the cleaning gas and the time, and FIG. 3B illustrates a relationship between the temperature of the exhaust connection portion and the time. Hereinafter, the flow rate of the cleaning gas is set to be the total flow rate of $F_2$ gas and NO gas.

(First Step $S_1$)

The cleaning gas is supplied into the processing chamber 14 at the first flow rate a. The supply of the cleaning gas at the first flow rate a into the processing chamber 14 is continuously performed until the temperature of the exhaust connection portion 45 reaches the first temperature d. Herein, the first flow rate a is a predetermined upper limit flow rate that can be supplied into the processing chamber 14. By supplying the cleaning gas into the processing chamber 14 at the upper limit flow rate, most of the deposits in the processing chamber 14 can be removed at once. When the cleaning gas is supplied at the first flow rate a, the reaction amount between the deposits and the cleaning gas in the processing chamber 14 is large, and thus, the temperature in the processing chamber 14 is increased, so that the temperature of the gas passing through the exhaust connection portion 45 is increased. Along with the increase in temperature of the gas, the temperature of the exhaust connection portion 45 is rapidly increased. Namely, in the first step, the temperature of the exhaust connection portion 45 is greatly affected by the heat generated by the reaction in the processing chamber 14. Herein, the first temperature d is a maximum temperature at which the temperature of the exhaust connection portion 45 is allowed to converge to a later-described second temperature c (tolerance temperature) by reducing the supply flow rate of the cleaning gas from the first flow rate a. For example, in the case where the temperature is higher than the first temperature d, when the supply flow rate of the cleaning gas is decreased from the first flow rate a, the convergence of the temperature of the exhaust connection portion 45 cannot be made in time, and as a result, the temperature of the exhaust connection portion 45 exceeds the tolerance temperature.

(Second Step $S_2$)

When the temperature of the exhaust connection portion 45 reaches the first temperature d, the cleaning gas is supplied into the processing chamber 14, while the flow rate of the cleaning gas is gradually decreased to the second flow rate b lower than the first flow rate a. At this time, it is preferable that the flow rate of the cleaning gas is monotonically decreasing and downward-convex function such as the exponential function of time. In the second step, the temperature of the exhaust connection portion 45 is affected by heat generated by the reaction in the processing chamber 14 and heat generated by the reaction in the exhaust connection portion 45. By exponentially decreasing the flow rate, the temperature of the exhaust connection portion 45 is allowed to converge near to the tolerance temperature without an acute overshoot.

(Third Step $S_3$)

When the temperature of the exhaust connection portion 45 reaches the second temperature c higher than the first temperature d, the cleaning gas is supplied into the processing chamber 14 at a flow rate controlled to keep the temperature at c. For such the control, the flow rate of the cleaning gas may be gradually decreased to the flow rate lower than the second flow rate b with fluctuations (small increasing and decreasing) caused by an imperfect control model. In this context, the flow rate needs to macroscopically decrease during the step $S_3$. By the control of the flow rate, the temperature of the exhaust connection portion 45 is allowed to converge to the second temperature c, and furthermore, is maintained at the second temperature c. Herein, the temperature of the exhaust connection portion 45 may not completely reach the second temperature c. For example, even in the case where the temperature is close to the second temperature c and the flow rate of the cleaning gas is set to a flow rate lower than the second flow rate b, any temperature which gradually reaches (converges to) the second temperature c, can be regarded to be substantially equivalent to the second temperature c. In the third step, the temperature of the exhaust connection portion 45 is greatly affected by the heat generated by the reaction in the exhaust connection portion 45. Since the reaction in the exhaust connection portion 45 progresses gently, a time difference occurs between the supply flow rate of the cleaning gas and the increase in temperature of the exhaust connection portion 45. Therefore, by controlling the flow rate of the cleaning gas so that the flow rate of the cleaning gas is gradually decreased while increasing and decreasing of the flow rate is repeated, it is possible to perform control so that the exhaust connection portion 45 does not exceed the tolerance temperature by the reaction heat in the exhaust connection portion 45. In addition, ☐fluctuant supplying of the cleaning gas causes increase and decrease of the internal pressure of the processing chamber 14, and helps the cleaning gas pervade well within the processing chamber 14 including the corners. In addition, since the exhaustion in the processing chamber 14 can be smoothly performed, it is possible to improve the cleaning capability.

After the third step is performed for a predetermined time, the supply of the cleaning gas is stopped, and the $N_2$ gas is supplied from the inert gas supply unit. When the internal gas of the processing chamber 14 is replaced with $N_2$ gas and the internal pressure of the processing chamber 14 is restored to normal pressure, the lid 22 is moved down by the boat elevator 32, and the boat 26 is carried out from the reaction tube 10.

In the above-described cleaning process, the total flow rate of the $F_2$ gas and the NO gas is controlled as the flow rate of the cleaning gas. At this time, it is preferable to control the flow rate of the $F_2$ gas and the flow rate of the NO gas so that they are the same. In addition, an inert gas together with the cleaning gas may be supplied into the processing chamber 14. As the PID controller 51, a commercially available controller called a heating/cooling controller or a cascade PID can be used. Namely, a manipulated variable for cooling or an manipulated variable for an outer loop (referred to as a second manipulated variable) is assigned to the gas flow rate. During the first step, the controller 100 directly sets the flow rates for the MFCs 38a and 38b, sets the same flow rate for the PID controller 51 as the lower limit value (and/or upper limit value) of the second manipulated variable, and prohibits outputting a second manipulated variable. Then, during the second and third steps, the second manipulated variable is output from the PID controller 51 to the MFCs 38a and 38b. If the second manipulated variable calculated by the PID controller 51 is not suited for a gradually decreasing curve during the second step, the controller 100 may directly set the flow rates for the MFCs 38a and 38b as with the first step.

<Effects of the Embodiment>

According to the embodiment, it is possible to obtain one effect or a plurality of effects, as follows.

(1) By controlling the flow rate of the cleaning gas on the basis of the temperature of the exhaust connection portion, it is possible to perform the cleaning in a state where the temperature of the exhaust connection portion is maintained in the vicinity of the tolerance temperature at which the best cleaning efficiency is obtained, and thus, it is possible to shorten the cleaning time. Along with the shortening of the cleaning time, it is possible to improve productivity. In addition, according to the manual cleaning by the operator or the sequence process based on the operator's experience, since the supply and the stop of supply of the cleaning gas is controlled while monitoring the temperature of the pipe, it is difficult to maintain the exhaust connection portion at a constant temperature. Since stopping of supply of the cleaning gas leads to a time delay for cooling the exhaust connection portion, the cleaning time may be lengthened. On the contrary, according to the disclosure, since the temperature of the exhaust connection portion can be maintained at a constant temperature not exceeding the tolerance temperature, it is possible to shorten the cleaning time and improve the productivity.

(2) By performing the cleaning process on the basis of the temperature of the exhaust connection portion, it is possible to prevent corrosion of the metal member, and thus, it is possible to suppress the generation of particles. Therefore, it is possible to improve the yield of products.

In addition, the exhaust connection portion is installed at the position nearest to the reaction tube, and thus, the exhaust connection portion is most greatly affected by the interior of the reaction tube. Therefore, by monitoring only the exhaust connection portion, it is also possible to simultaneously suppress the corrosion of the exhaust pipe portion in the subsequent stages.

(3) By detecting the temperature of the exhaust connection portion by using the temperature detector of the heater for heating the exhaust connection portion, the configuration of the apparatus can be simplified, so that it is possible to reduce the cost.

Heretofore, the embodiments of the invention have been described. However, the invention is not limited to the above-described embodiments, and various modifications can be made without departing from the spirit of the invention.

(Modified Example)

In the above-described embodiment, the flow rate of the cleaning gas is controlled so that the temperature of the exhaust connection portion 45 does not exceed the tolerance temperature, but the flow rate of the cleaning gas may be controlled so that the reaction amount between the deposits and the cleaning gas in the exhaust connection portion 45 do not exceed the threshold value.

It is preferable that the above-mentioned threshold value is a threshold value of the removal amount of deposits in the exhaust connection portion 45 (or the amount of reaction between the deposits and the cleaning gas) when the exhaust connection portion 45 exceeds the tolerance temperature by the reaction heat in the exhaust connection portion 45. The temperature gradient of the exhaust connection portion 45 depends on (1) the internal temperature of the processing chamber and (2) the reaction heat in the exhaust connection portion 45. Therefore, the temperature gradient A of the exhaust connection portion 45 according to (1) is measured in advance, and measurement data are stored in the controller 100. Since the temperature gradient C of the exhaust connection portion 45 measured in the actual cleaning process is based on the temperature gradient A according to (1) and the temperature gradient B according to (2), by deriving an increase in temperature of the exhaust pipe according to (2) from a difference between the temperature gradient C and the temperature gradient A, it is possible to detect (calculate) the removal amount of deposits.

Alternatively, detectors for detecting the gas concentrations may be respectively installed at the front stage and the rear stage of the exhaust connection portion 45 to calculate the removal amount of deposits removed in the exhaust connection portion 45 from a difference between detection values of the front stage and the rear stage. It is also possible to detect the concentration of a specific element contained in the deposits, for example, the concentration of the Si element and to derive the removal amount of deposits.

Heretofore, the embodiments of the invention have been described in detail. However, the invention is not limited to the above-described embodiments, and various modifications can be made without departing from the spirit of the invention.

For example, in the above-described embodiment, the example using the HCD gas as a source gas has been described, but the invention is not limited to such an embodiment. For example, as a source gas, besides the HCD gas, an inorganic halosilane source gas such as DCS ($SiH_2Cl_2$: dichlorosilane) gas, MCS ($SiH_3Cl$: monochlorosilane) gas, TCS ($SiHCl_3$: trichlorosilane) gas, an amino (amine) silane source gas containing no halogen group such as 3DMAS ($Si[N(CH_3)_2]_3H$: trisdimethylaminosilane) gas or BTBAS ($SiH_2[NH(C_4H_9)]_2$: bistertiarybutylaminosilane), an inorganic silane source gas containing no halogen group such as MS ($SiH_4$: monosilane) gas or DS ($Si_2H_6$: disilane) gas, or the like can be used.

For example, in the above-described embodiment, the example where the SiN film is formed has been described. However, the invention is not limited to such an embodiment. For example, rather than the above-described gases or in addition to the above-described gases, by using an oxygen (O) containing gas (oxidizing gas) such as oxygen ($O_2$) gas, a carbon (C) containing gas such as propylene ($C_3H_6$) gas, a boron (B) containing gas such as boron trichloride ($BCl_3$) gas, or the like, an SiON film, an SiOCN film, an SiOC film, an SiCN film, an SiBN film, an SiBCN film, or the like can be formed. Even in the case where these films are formed, film formation can be performed under the same processing conditions as those in the above-described embodiment, and thus, it is possible to obtain the same effects as those in the above-described embodiment.

In addition, for example, the invention may be appropriately applied to the case where a film containing a metal element such as titanium (Ti), zirconium (Zr), hafnium (Hf), tantalum (Ta), niobium (Nb), aluminum (Al), molybdenum (Mo), or tungsten (W), that is, a metal-based film is formed on the wafer W.

In addition, for example, the invention may be appropriately applied to the case where a halogen-containing gas such as nitrogen trifluoride ($NF_3$) gas, chlorine trifluoride ($ClF_3$) gas, or hydrogen fluoride (HF) gas is used as the cleaning gas. Particularly, among halogen-containing gases, the invention is appropriately applicable to a gas having exothermic properties.

What is claimed is:

1. A cleaning method comprising:
   removing deposits adhered to an inside of a processing vessel by forming a film on a substrate in the processing vessel, and after that, supplying a cleaning gas into the processing vessel,
   wherein the removing the deposits includes:
   a first step of supplying the cleaning gas into the processing vessel at a first flow rate when a temperature of a connection portion connecting an exhaust pipe that exhausts the interior of the processing vessel and the processing vessel is lower than a first temperature; and
   a second step of supplying the cleaning gas to the processing vessel while gradually decreasing the flow rate of the cleaning gas from the first flow rate to a second flow rate lower than the first flow rate when the temperature of the connection portion reaches a first temperature.

2. The cleaning method according to claim 1, wherein the removing the deposits further includes a third step of supplying the cleaning gas into the processing vessel while macroscopically decreasing the flow rate of the cleaning gas at flow rates lower than the second flow rate so that a second temperature is maintained after the temperature of the connection portion reaches the second temperature higher than the first temperature.

3. The cleaning method according to claim 1, wherein the flow rate of the cleaning gas decreases exponentially in the second step.

4. The cleaning method according to claim 2, wherein the second temperature is set according to a tolerance temperature of the exhaust pipe to the cleaning gas.

5. The cleaning method according to claim 2, wherein in the third step, the flow rate of the cleaning gas fluctuates during the macroscopic decrease so that a pressure in the processing vessel increases and decreases.

6. A method of manufacturing a semiconductor device, comprising:
   forming a film on a substrate in a processing vessel; and
   removing deposits adhered to an inside of the processing vessel by supplying a cleaning gas into the processing vessel,
   wherein the removing the deposits includes:
   a first step of supplying the cleaning gas into the processing vessel at a first flow rate when a temperature of a connection portion connecting an exhaust pipe that exhausts the interior of the processing vessel and the processing vessel is lower than a first temperature; and
   a second step of supplying the cleaning gas to the processing vessel while gradually decreasing the flow rate of the cleaning gas from the first flow rate to a second flow rate lower than the first flow rate when the temperature of the connection portion reaches a first temperature.

7. A substrate processing apparatus, comprising:
   a processing vessel accommodating a substrate in the processing vessel;
   a film forming gas supply unit that supplies a film forming gas to the substrate in the processing vessel;
   a cleaning gas supply unit that supplies a cleaning gas into the processing vessel;
   a connection portion connecting an exhaust pipe that exhausts an interior of the processing vessel and the processing vessel; and
   a controller that controls the film forming gas supply unit and the cleaning gas supply unit to perform forming a film by supplying the film forming gas to the substrate in the processing vessel and removing deposits adhered to the inside of the processing vessel by supplying the cleaning gas into the processing vessel, wherein, in the removing the deposits, when the temperature of the connection portion is lower than a first temperature, a first process of supplying the cleaning gas into the processing vessel at a first flow rate is performed, and when the temperature of the connection portion reaches the first temperature, a second process of supplying the cleaning gas to the interior of the processing vessel while gradually decreasing the flow rate of the cleaning gas from the first flow rate to a second flow rate lower than the first flow rate is performed.

* * * * *